(12) United States Patent
 Choi

(10) Patent No.: US 11,699,665 B2
(45) Date of Patent: Jul. 11, 2023

(54) SEMICONDUCTOR MODULE

(71) Applicant: SAMSUNG ELECTRONICS CO., LTD., Suwon-si (KR)

(72) Inventor: Beoungjun Choi, Sejong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 31 days.

(21) Appl. No.: 17/172,797

(22) Filed: Feb. 10, 2021

(65) Prior Publication Data

US 2021/0407926 A1  Dec. 30, 2021

(30) Foreign Application Priority Data

Jun. 26, 2020 (KR) .................... 10-2020-0078293

(51) Int. Cl.
| | |
|---|---|
| *H01L 23/552* | (2006.01) |
| *H01L 23/495* | (2006.01) |
| *H01L 23/31* | (2006.01) |
| *H05K 1/02* | (2006.01) |
| *H01L 25/065* | (2023.01) |
| *H01L 23/00* | (2006.01) |

(52) U.S. Cl.
CPC ........ *H01L 23/552* (2013.01); *H01L 23/3121* (2013.01); *H01L 23/49575* (2013.01); *H01L 24/32* (2013.01); *H01L 25/0657* (2013.01); *H05K 1/0218* (2013.01); *H01L 2224/32145* (2013.01); *H01L 2224/32225* (2013.01); *H01L 2224/32245* (2013.01); *H05K 2201/10371* (2013.01)

(58) Field of Classification Search
CPC ............... H01L 23/552; H01L 23/3121; H01L 23/49575; H01L 24/32; H01L 25/0657; H05K 1/0218
See application file for complete search history.

(56) References Cited

U.S. PATENT DOCUMENTS

| | | | |
|---|---|---|---|
| 7,488,903 | B2 | 2/2009 | Kawagishi et al. |
| 7,723,836 | B2 | 5/2010 | Kwon et al. |
| | | (Continued) | |

FOREIGN PATENT DOCUMENTS

| | | |
|---|---|---|
| KR | 10-0505241 | 8/2005 |
| KR | 10-0714917 | 4/2007 |

*Primary Examiner* — Jasmine J Clark
(74) *Attorney, Agent, or Firm* — F. Chau & Associates, LLC

(57) ABSTRACT

A semiconductor module includes a main board and external terminals. A package substrate includes a core insulation layer, a conductive pattern disposed in the core insulation layer and electrically connected with the external terminals, an upper insulation pattern and a lower insulation pattern. At least one semiconductor chip is disposed on an upper surface of the package substrate and is electrically connected with the conductive pattern. A shielding plate is disposed on a molding member and lateral side surfaces of the package substrate and shields electromagnetic interference (EMI) emitted from the semiconductor chip. A shielding fence extends from an edge portion of a lower surface of the lower insulation pattern and directly contacts the upper surface of the main board. The shielding fence surrounds the external terminals and shields EMI emitted from the external terminals. A reinforcing member increases a strength of the shielding fence.

20 Claims, 8 Drawing Sheets

(56) References Cited

U.S. PATENT DOCUMENTS

| | | |
|---|---|---|
| 8,829,667 B2 | 9/2014 | Park et al. |
| 9,595,454 B2 * | 3/2017 | Huang .............. H01L 23/49894 |
| 9,922,937 B2 | 3/2018 | Kuhlman |
| 9,974,181 B2 | 5/2018 | Haney et al. |
| 2012/0074538 A1 * | 3/2012 | Tsai .................... H01L 23/3121 |
| | | 257/659 |
| 2012/0300412 A1 * | 11/2012 | Song ................. H01L 23/49822 |
| | | 361/728 |
| 2015/0264797 A1 | 9/2015 | Happoya et al. |
| 2015/0380361 A1 * | 12/2015 | Lee ........................ H01L 24/97 |
| | | 257/659 |
| 2019/0074251 A1 | 3/2019 | Kang et al. |
| 2019/0191597 A1 | 6/2019 | Han et al. |

* cited by examiner

SEMICONDUCTOR MODULE

CROSS-REFERENCE TO RELATED APPLICATION

This application claims priority under 35 U.S.C. § 119 to Korean Patent Application No. 10-2020-0078293, filed on Jun. 26, 2020 in the Korean Intellectual Property Office, the disclosure of which is incorporated by reference in its entirety herein.

TECHNICAL FIELD

The present inventive concepts relate to a semiconductor module. More particularly, the present inventive concepts relate to a semiconductor module including a semiconductor package mounted on a main board.

DISCUSSION OF RELATED ART

Generally, a semiconductor module may include a main board, a plurality of external terminals and a semiconductor package. The semiconductor package may be mounted on the main board via the plurality of external terminals.

According to related arts, a shielding plate may be configured to surround an upper surface and lateral side surfaces of the semiconductor package to shield an electromagnetic interference (EMI) emitted from the semiconductor package. However, since the lateral side surfaces of the external terminals may be exposed, the EMI emitted from the external terminals may not be shielded.

SUMMARY

Exemplary embodiments of the present inventive concepts provide a semiconductor module that may shield an EMI emitted from external terminals.

According to an exemplary embodiment of the present inventive concepts, a semiconductor module may include a main board and a plurality of external terminals disposed on an upper surface of the main board. A package substrate includes a core insulation layer, a conductive pattern disposed in the core insulation layer and configured to be electrically connected with the plurality of external terminals and an upper insulation pattern and a lower insulation pattern. The upper insulation pattern is disposed on an upper surface of the core insulation layer and partially exposes the conductive pattern. The lower insulation pattern is disposed on a lower surface of the core insulation layer and partially exposes the conductive pattern. At least one semiconductor chip is disposed on an upper surface of the package substrate and is configured to be electrically connected with the conductive pattern. A molding member is disposed on the upper surface of the package substrate and covers the at least one semiconductor chip. A shielding plate is disposed on an upper surface and lateral side surfaces of the molding member and lateral side surfaces of the package substrate and is configured to shield electromagnetic interference (EMI) emitted from the at least one semiconductor chip. A shielding fence extends from an edge portion of a lower surface of the lower insulation pattern. The shielding fence directly contacts the upper surface of the main board. The shielding fence surrounds the external terminals and is configured to shield EMI emitted from the plurality of external terminals. A reinforcing member is disposed in the shielding fence and is configured to increase a strength of the shielding fence.

According to an exemplary embodiment of the present inventive concepts, a semiconductor module includes a main board. A plurality of external terminals is disposed on an upper surface of the main board. A package substrate includes a core insulation layer, a conductive pattern disposed in the core insulation layer and configured to be electrically connected with the plurality of external terminals, an upper insulation pattern and a lower insulation pattern. The upper insulation pattern is disposed on an upper surface of the core insulation layer and partially exposes the conductive pattern. The lower insulation pattern is disposed on a lower surface of the core insulation layer and partially exposes the conductive pattern. At least one semiconductor chip is disposed on an upper surface of the package substrate and is configured to be electrically connected with the conductive pattern. A molding member is disposed on the upper surface of the package substrate and covers the at least one semiconductor chip. A shielding plate is disposed on an upper surface and lateral side surfaces of the molding member and lateral side surfaces of the package substrate and is configured to shield electromagnetic interference (EMI) emitted from the at least one semiconductor chip. A shielding fence is disposed between an edge portion of a lower surface of the lower insulation pattern and the upper surface of the main board. The shielding fence surrounds the plurality of external terminals and is configured to shield EMI emitted from the external terminals.

According to an exemplary embodiment of the present inventive concepts, a semiconductor module includes a main board. A plurality of external terminals is disposed on an upper surface of the main board. A semiconductor package is disposed over the main board. The semiconductor package includes a shielding fence surrounding the external terminals and configured to shield electromagnetic interference (EMI) emitted from the external terminals. The plurality of external terminals is configured to electrically connect the semiconductor package with the main board. A shielding plate is disposed on an upper surface and lateral side surfaces of the molding member and lateral side surfaces of the package substrate. A shielding fence surrounds the semiconductor package. The shielding fence is electrically connected to a ground terminal among the external terminals and the shielding fence is configured to discharge an EMI emitted from the semiconductor package through the ground terminal.

According to exemplary embodiments of the present inventive concepts, the shielding fence may surround the external terminals to shield the EMI emitted from the external terminals. The shielding fence may be integral with the lower insulation pattern extended from the lower insulation pattern. Thus, it may not be required to perform an additional process for forming the shielding fence. Further, the shielding plate may be electrically connected with the ground terminal through the conductive pattern to discharge the EMI emitted from the semiconductor chip through the ground terminal.

DESCRIPTION OF THE DRAWINGS

Exemplary embodiments of the present inventive concepts will be more clearly understood from the following detailed description taken in conjunction with the accompanying drawings.

FIG. 1 is a cross-sectional view illustrating a semiconductor module according to an exemplary embodiment of the present inventive concepts;

FIG. 2 is a bottom view illustrating a package substrate of the semiconductor module in FIG. 1 according to an exemplary embodiment of the present inventive concepts;

FIG. 3 is an enlarged cross-sectional view of a portion "A" in FIG. 1 according to an exemplary embodiment of the present inventive concepts;

FIG. 4 is a cross-sectional view illustrating a semiconductor module according to an exemplary embodiment of the present inventive concepts;

FIG. 5 is an enlarged cross-sectional view of a portion "B" in FIG. 4 according to an exemplary embodiment of the present inventive concepts;

FIG. 6 is a cross-sectional view illustrating a semiconductor module according to an exemplary embodiment of the present inventive concepts;

FIG. 7 is a cross-sectional view illustrating a semiconductor module according to an exemplary embodiment of the present inventive concepts;

FIG. 8 is a cross-sectional view illustrating a semiconductor module according to an exemplary embodiment of the present inventive concepts; and FIG. 9 is a cross-sectional view illustrating a semiconductor module according to an exemplary embodiment of the present inventive concepts.

DETAILED DESCRIPTION OF EXEMPLARY EMBODIMENTS

Hereinafter, exemplary embodiments of the present inventive concepts will be explained in detail with reference to the accompanying drawings.

Figure 1:
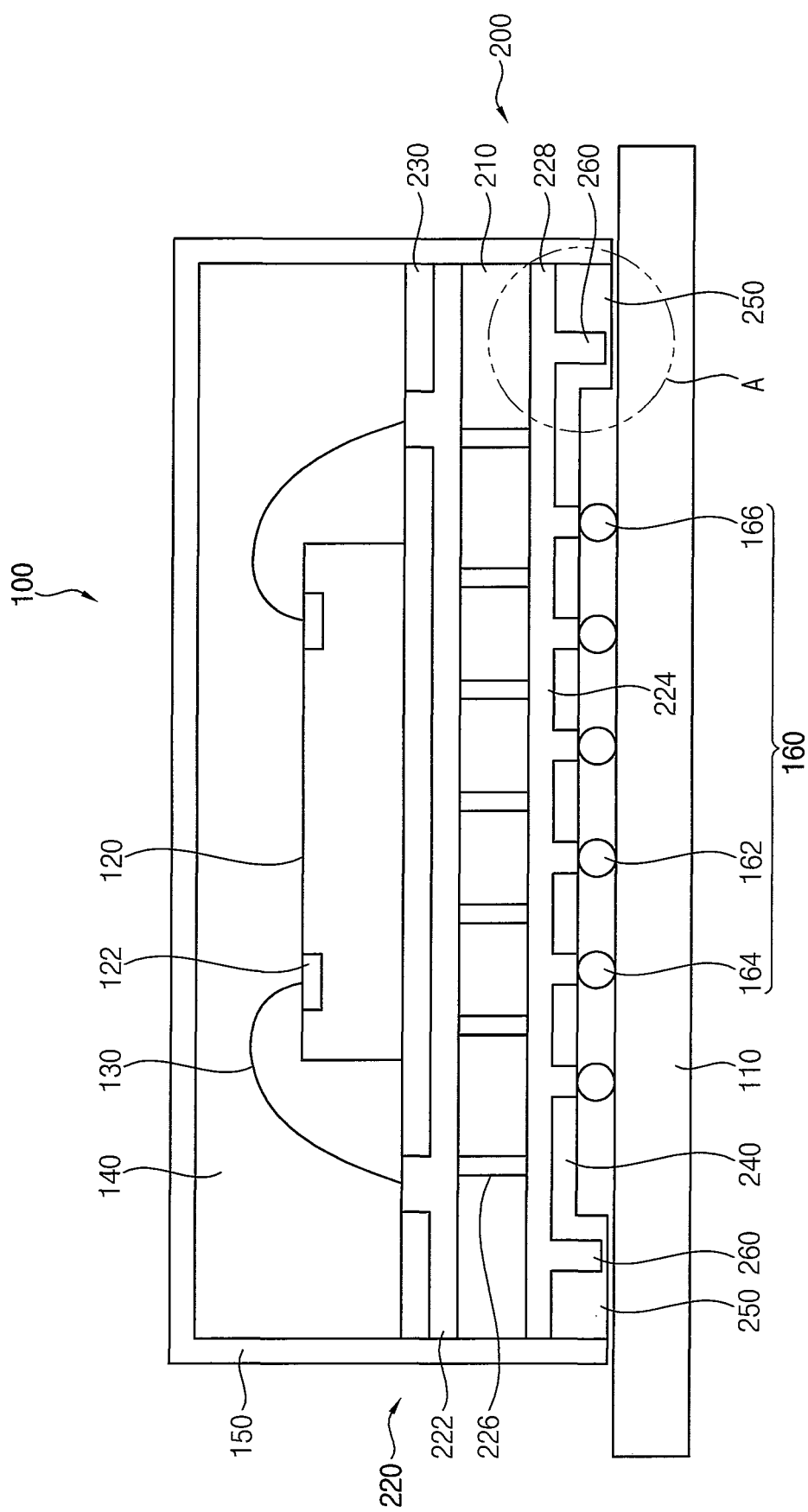
FIGS. 1 to 9 represent ion-limiting, exemplary embodiments as described herein.
Figure 2:
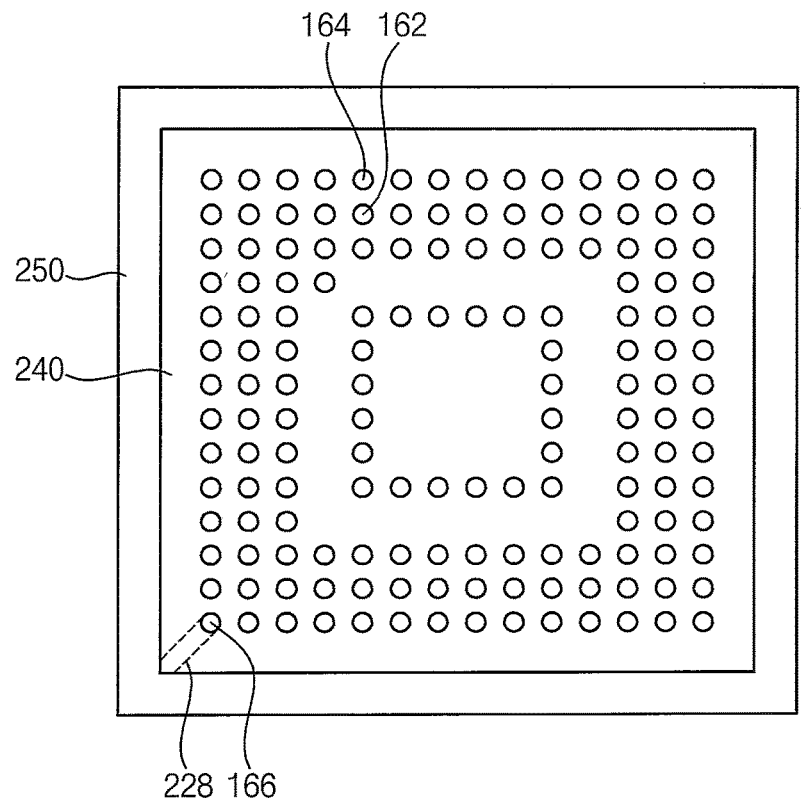
Figure 3:
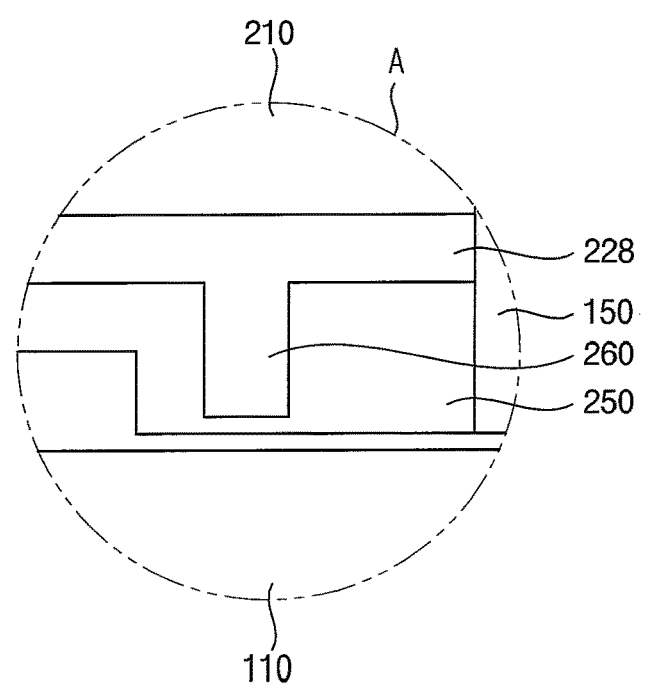

FIG. 1 is a cross-sectional view illustrating a semiconductor module according to an exemplary embodiment of the present inventive concepts. FIG. 2 is a bottom view illustrating a package substrate of the semiconductor module in FIG. 1 according to an exemplary embodiment of the present inventive concepts. FIG. 3 is an enlarged cross-sectional view of a portion "A" in FIG. 1 according to an exemplary embodiment of the present inventive concepts.

Referring to the exemplary embodiments of FIGS. 1 to 3, a semiconductor module 100 of exemplary embodiments of the present inventive concepts may include a main board 110, a plurality of external terminals 160, a semiconductor package and a shielding plate 150.

The external terminals 160 may be arranged on (e.g., disposed on) an upper surface of the main board 110 and may be spaced apart in a direction parallel to the upper surface of the main board 110. As shown in the exemplary embodiment of FIG. 1, the external terminals 160 may include a signal terminal 162, a power terminal 164 and a ground terminal 166. The external terminals 160 may include solder balls.

The semiconductor package may be arranged over the main board 110. The semiconductor package may be electrically connected with the main board 110 via the external terminals 160. For example, the external terminals 160 may be interposed between a lower surface of the package substrate 200 and the upper surface main board 110 to electrically connect the semiconductor package with the main board 110.

As shown in the exemplary embodiment of FIG. 1, the semiconductor package may include a package substrate 200, a semiconductor chip 120, a conductive wire 130 and a molding member 140. The package substrate 200 may be disposed over the main board 110. The package substrate 200 may be electrically connected with the main board 110 through the external terminals 160.

The semiconductor chip 120 may be disposed on an upper surface of the package substrate 200. The semiconductor chip 120 may include a pad 122. In an exemplary embodiment, the pad 122 may be disposed on an upper surface of the semiconductor chip 120.

The conductive wire 130 may be electrically connected between the pad 122 of the semiconductor chip 120 and the package substrate 200. For example, as shown in the exemplary embodiment of FIG. 1, the conductive wire 130 may include an upper end connected to the pad 122 of the semiconductor chip 120, and a lower end connected to the package substrate 200.

The molding member 140 may be formed on the upper surface of the package substrate 200 to cover the semiconductor chip 120. In an exemplary embodiment, the molding member 140 may include an epoxy molding compound (EMC). However, exemplary embodiments of the present inventive concepts are not limited thereto.

The package substrate 200 may include a core insulation layer 210, a conductive pattern 220, an upper insulation pattern 230 and a lower insulation pattern 240. The core insulation layer 210 may include an insulation material. The material of the core insulation layer 210 may be any insulation material and is not restricted to a specific material.

The conductive pattern 220 may include an upper conductive pattern 222, a lower conductive pattern 224 and conductive lines 226. As shown in the exemplary embodiment of FIG. 1, the upper conductive pattern 222 may be disposed on an upper surface of the core insulation layer 210. For example, a lower surface of the upper conductive pattern 222 may directly contact an upper surface of core insulation layer 210 and an upper surface of the conductive lines 226. The upper conductive pattern 222 may include a plurality of upper pads. The lower end of the conductive wire 130 may be connected to the upper pad of the upper conductive pattern 222. For example, as shown in the exemplary embodiment of FIG. 1, the semiconductor chip 120 may include two pads 122 and the upper conductive pattern 222 may include two upper pads which are respectively connected to each other by a conductive wire 130. However, in other exemplary embodiments, the numbers of the pads 122, the upper pads of the upper conductive patterns 222 and the conductive wires 130 may vary. The lower conductive pattern 224 may be disposed on a lower surface of the core insulation layer 210. The lower conductive pattern 224 may include a plurality of lower pads. For example, as shown in the exemplary embodiment of FIG. 1, the lower conductive pattern 224 may have two lower pads. However, exemplary embodiments of the present inventive concepts are not limited thereto and the number of the lower pads may vary in other exemplary embodiments. The conductive lines 226 may be extend vertically through the core insulation layer 210 to electrically connect the upper conductive pattern 222 with the lower conductive pattern 224. The conductive lines 226 may be spaced apart from each other in a direction parallel to an upper surface of the main board 110. In an exemplary embodiment, the conductive pattern 220 may include a metal such as copper. However, exemplary embodiments of the present inventive concepts are not limited thereto and the material of the conductive pattern 220 may vary in other exemplary embodiments.

The upper insulation pattern 230 may be disposed on the upper surface of the core insulation layer 210. The upper insulation pattern 230 may include openings that expose the upper pads of the upper conductive pattern 222. In an exemplary embodiment, the upper insulation pattern 230 may include solder resist. However, exemplary embodiments of the present inventive concepts are not limited thereto and the upper insulation pattern 230 may include different materials in other exemplary embodiments.

The lower insulation pattern 240 may be disposed on the lower surface of the core insulation layer 210. The lower insulation pattern 240 may include openings that expose the lower pads of the lower conductive pattern 224. In an exemplary embodiment, the lower insulation pattern 240 may include solder resist. However, exemplary embodiments of the present inventive concepts are not limited thereto and the lower insulation pattern 240 may include different materials in other exemplary embodiments. The external terminals 160 may electrically connect the lower pads of the lower conductive pattern 224 exposed through the openings of the lower insulation pattern 240 with the main board 110.

However, exemplary embodiments of the present inventive concepts are not limited to the arrangement of the package substrate 200 shown in the exemplary embodiment of FIG. 1. For example, in another exemplary embodiment, the package substrate 200 may include a single metal pattern, an upper insulation pattern disposed on an upper surface of the single metal pattern, and a lower insulation pattern disposed on a lower surface of the single metal pattern.

A shielding fence 250 may surround the external terminals 160. The shielding fence 250 may shield an electromagnetic interference (EMI) horizontally emitted from the external terminals 160, such as an outermost external terminal.

As shown in the exemplary embodiments of FIGS. 1-3, the shielding fence 250 may be disposed between an edge portion of a lower surface of the lower insulation pattern 240 and the upper surface of the main board 110. For example, the shielding fence 250 may be disposed on lateral edges of a lower surface of the lower insulation pattern 240 and may extend downwardly towards the upper surface of the main board 110. In an exemplary embodiment, the shielding fence 250 may wholly surround the external terminals 160. In an exemplary embodiment, the shielding fence 250 may have a rectangular frame shape. For example, the shielding fence 250 may be extended from the edge portion of the lower surface of the lower insulation pattern 240 towards the upper surface of the main board 110. For example, the shielding fence 250 may be integral with the lower insulation pattern 240. Thus, the shielding fence 250 may include a material that is substantially the same as a material of the lower insulation pattern 240. For example, in an exemplary embodiment, the shielding fence 250 may include the solder resist. Therefore, since the shielding fence 250 may be formed together with the lower insulation pattern 240, an additional process may not be required to form the shielding fence 250.

The shielding fence 250 may have a lower surface that is spaced apart from the upper surface of the main board 110. For example, the shielding fence 250 may have a thickness that extends from a level of the lower surface of the lower insulation pattern 240 less than a thickness of the external terminal 160. Thus, a gap may be formed between the lower surface of the shielding fence 250 and the upper surface of the main board 110. In an exemplary embodiment, the gap may provide a degree of tolerance in the process for forming the shielding fence 250 on the lower insulation pattern 240. For example, when the shielding fence 250 extended from the lower insulation pattern 240 has a thickness that is thicker than the thickness of the external terminal 160, a distance between the lower conductive pattern 224 and the main board 110 may be increased more than an intended minimum distance. In this case, the external terminal 160 may not make contact with the main board 110 and the package substrate 200 may not be electrically connected with the main board 110. However, in an exemplary embodiment of the present inventive concepts, the thickness of the shielding fence 250 may be less than the thickness of the external terminal 160 and an electrical connection failure between the package substrate 200 and the main board 110 may be prevented.

In an exemplary embodiment, the thickness of the shielding fence 250 may be in a range of about ⅔ of the size of the thickness of the external terminal 160 to less than the thickness of the external terminal 160. For example, in a exemplary embodiment in which the thickness of the external terminal 160 is about 140 μm, the thickness of the shielding fence 250 may be in a range of about 93.3 μm to less than about 140 μm. In an exemplary embodiment in which the thickness of the external terminal 160 is about 500 μm, the thickness of the shielding fence 250 may be in a range of about 333.3 μm to less than about 500 μm. In an exemplary embodiment, the shielding fence 250 may have a width in a horizontal direction (e.g., parallel to an upper surface of the main board 110) of no less than about 200 μm.

Since the shielding fence 250 may wholly surround the external terminals 160, the EMI emitted from the external terminals 160 may be shielded by the shielding fence 250 to suppress the EMI emitted from the external terminals from being discharged toward an outside of the semiconductor module 100.

Additionally, a reinforcing member 260 may be disposed in the shielding fence 250 to increase (e.g., reinforce) the strength of the shielding fence 250. As shown in the exemplary embodiment of FIG. 1, the reinforcing member 260 may extend vertically from a lower surface of the lower conductive pattern 224 into the shielding fence 250. For example, the reinforcing member 260 may be integral with the lower conductive pattern 224. Thus, since the reinforcing member 260 may be formed together with the lower conductive pattern 224, an additional process may not be required for forming the reinforcing member 260.

For example, in a process for forming the lower conductive pattern 224 by patterning a lower conductive layer on the lower surface of the core insulation layer 210, an edge portion of the lower conductive pattern 224 may have a thickness that is thicker than a thickness of a central portion of the lower conductive pattern 224. Thus, the reinforcing member 260 may be formed at the lower conductive pattern 224 by the process for forming the lower conductive pattern 224.

The shielding fence 250 may also be formed at the lower insulation pattern 240 by the process for forming the lower conductive pattern 224 having a uniform thickness on the lower conductive pattern 224 with the reinforcing member 260. For example, since the reinforcing member 260 may protrude downwardly from the lower conductive pattern 224, a portion of the lower conductive pattern 240 on the reinforcing member 260, such as the shielding fence 250 may be protrude downwardly from a portion of the lower conductive pattern 240 on the central portion of the lower conductive pattern 224. As a result, the reinforcing member 260 and the shielding fence 250 may be formed during the formation of the lower conductive pattern and additional processes for forming the reinforcing member 260 and the shielding fence 250 may not be necessary.

The EMI may also be emitted from the semiconductor chip 120 as well as the external terminal 160. As shown in the exemplary embodiment of FIG. 1, the shielding plate 150 may surround the semiconductor chip 120 to shield the EMI emitted from the semiconductor chip 120. In an exemplary embodiment, the shielding plate 150 may include a conductive material such as a metal.

The shielding plate 150 may be disposed on an upper surface and lateral side surfaces of the molding member 140, and lateral side surfaces of the package substrate 200. Thus, the semiconductor chip 120 may be surrounded by the shielding plate 150. In a comparative embodiment, when the shielding plate 150 is disposed on the lower surface of the package substrate 200, an electrical short may be generated between the external short 160 due to the conductive shielding plate 150. Therefore, the shielding plate 150 may not be disposed on the lower surface of the package substrate 200.

The shielding plate 150 may be electrically connected with the ground terminal 166 among the external terminals 160 through the lower conductive pattern 224 to increase the EMI shielding efficiency of the shielding plate 150. For example, a portion of the shielding plate 150 on side surfaces (e.g., lateral ends) of the package substrate 200 may be connected to the lower conductive pattern 224. Thus, the lower conductive pattern 224 may include a ground line 228 connected to the portion of the shielding plate 150 on the side surfaces of the package substrate 200. As a result, the EMI emitted from the semiconductor chip 120 may be discharged through the ground terminal 166 via the shielding plate 150, the ground line 228 and the lower conductive pattern 224.

Figure 4:
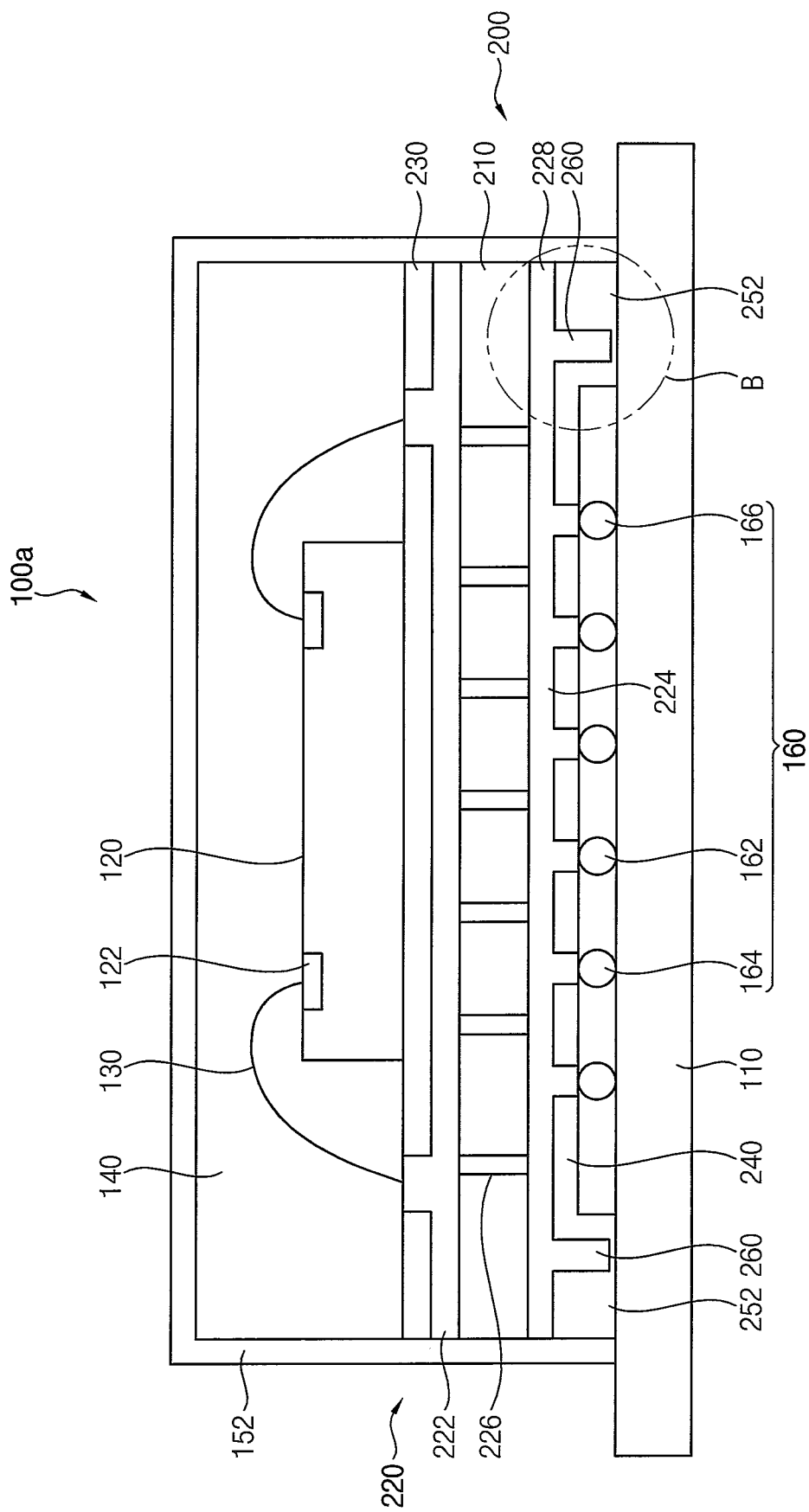
Figure 5:
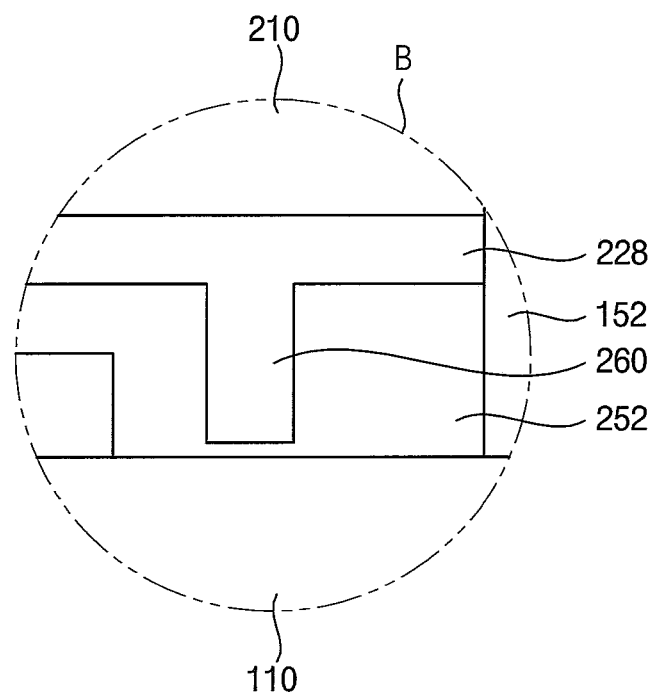

FIG. 4 is a cross-sectional view illustrating a semiconductor module in accordance with an exemplary embodiment of the present inventive concepts. FIG. 5 is an enlarged cross-sectional view of a portion "B" in FIG. 4 according to an exemplary embodiment of the present inventive concepts.

The semiconductor module 100a of the exemplary embodiments of FIGS. 4-5 may include elements that are substantially the same as the elements of the semiconductor module 100 in the exemplary embodiment of FIG. 1 except for a shielding fence. The same reference numerals may refer to the same elements and repeated descriptions of substantially similar elements may be omitted for convenience of explanation.

Referring to the exemplary embodiments of FIGS. 4 and 5, a shielding fence 252 may have a lower surface that directly contacts the upper surface of the main board 110. For example, the shielding fence 252 may have a thickness that extends from the lower surface of the lower conductive pattern substantially the same as the thickness of the external terminal 160. Thus, a gap may not be formed between the lower surface of the shielding fence 252 and the upper surface of the main board 110. Therefore, the space between the lower surface of the package substrate 200 and an upper surface of the main board 110 may be fully blocked (e.g., filled) by the shielding fence 252. As a result, since the space through which the EMI emitted from the external terminals 160 may be discharged is blocked by the shielding fence 252, the shielding fence 252 of the exemplary embodiment of FIG. 4 may have an EMI shielding efficiency that is higher than the EMI shielding efficiency of the shielding fence 250 in the exemplary embodiment of FIG. 1.

By contacting the shielding fence 252 with the upper surface of the main board 110, a lower end of the shielding plate 150 may also directly contact the upper surface of the main board 110.

As mentioned above, the gap between the shielding fence 250 and the main board 110 in the exemplary embodiment of FIG. 1 may provide a degree of tolerance in the process for forming the shielding fence 250 on the lower insulation pattern 240. However, the gap may slightly decrease the EMI shielding efficiency of the shielding fence 252. Thus, as shown in the exemplary embodiments of FIGS. 4-5, the lower surface of the shielding fence 252 may directly contact the upper surface of the main board 110 to remove the gap between the shielding fence 252 and the main board 110.

Figure 6:
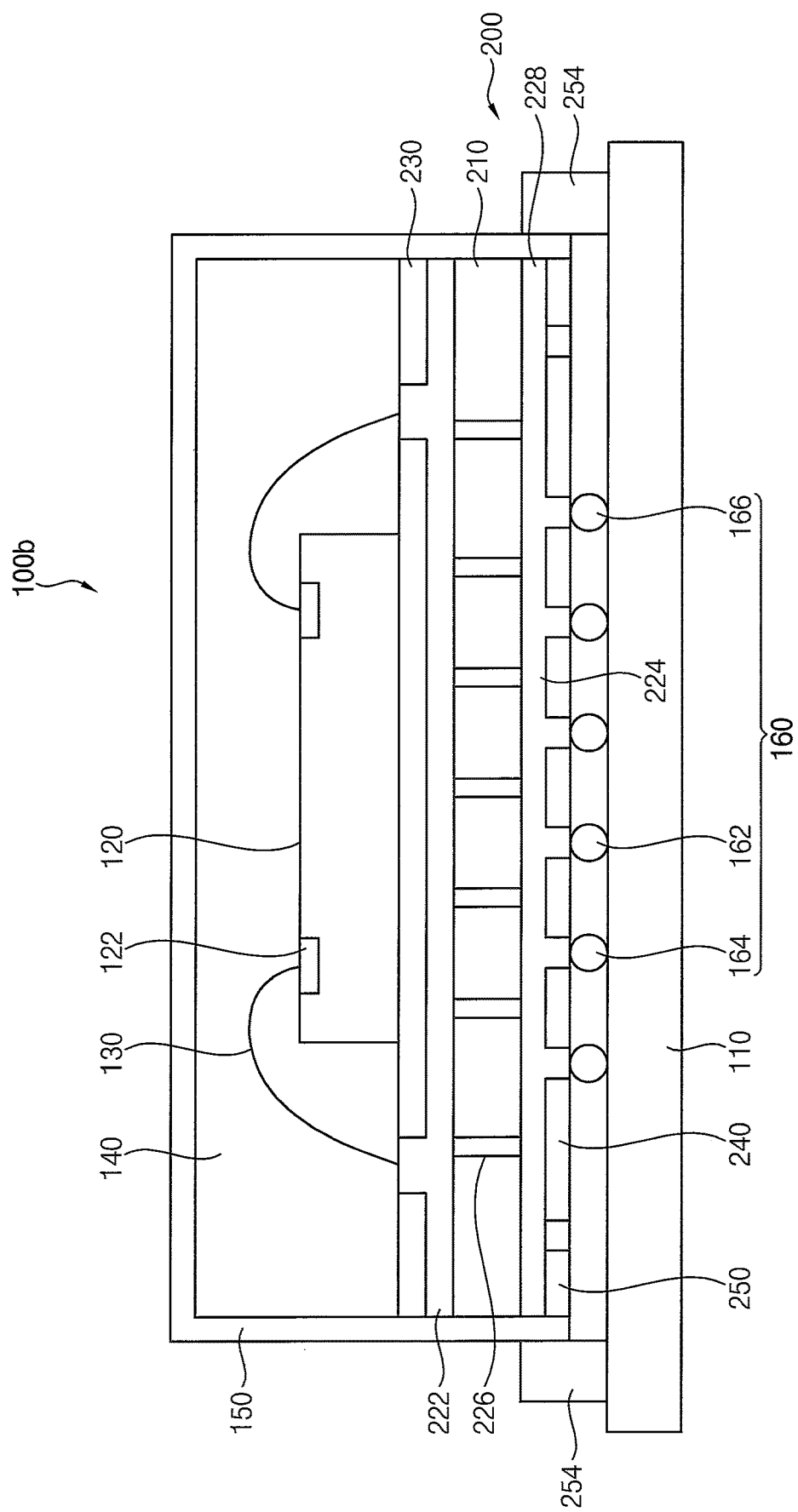

FIG. 6 is a cross-sectional view illustrating a semiconductor module according to an exemplary embodiment of the present inventive concepts.

The semiconductor module 100b of the exemplary embodiment of FIG. 6 may include elements that are substantially the same as the elements of the semiconductor module 100 in the exemplary embodiment of FIG. 1 except for a shielding fence. The same reference numerals may refer to the same elements and repeated descriptions of substantially similar elements may be omitted for convenience of explanation.

Referring to the exemplary embodiment of FIG. 6, a shielding fence 254 may be disposed outside the shielding plate 150. For example, the shielding fence 254 may be disposed on an outer surface of the shielding plate 150 to block the space between an upper surface of the main board 110 and the lower surface of the package substrate 200. In this exemplary embodiment, the shielding fence 254 may be an additional member that is separate from the lower insulation pattern 240 and is not integral with the lower insulation pattern 240. Thus, the shielding fence 254 may be formed by a process that is different from the process for forming the lower insulation pattern 240.

The shielding fence 254 in the exemplary embodiment of FIG. 6 may also surround the whole external terminals 160 to sufficiently shield the EMI emitted from the external terminals 160.

Figure 7:
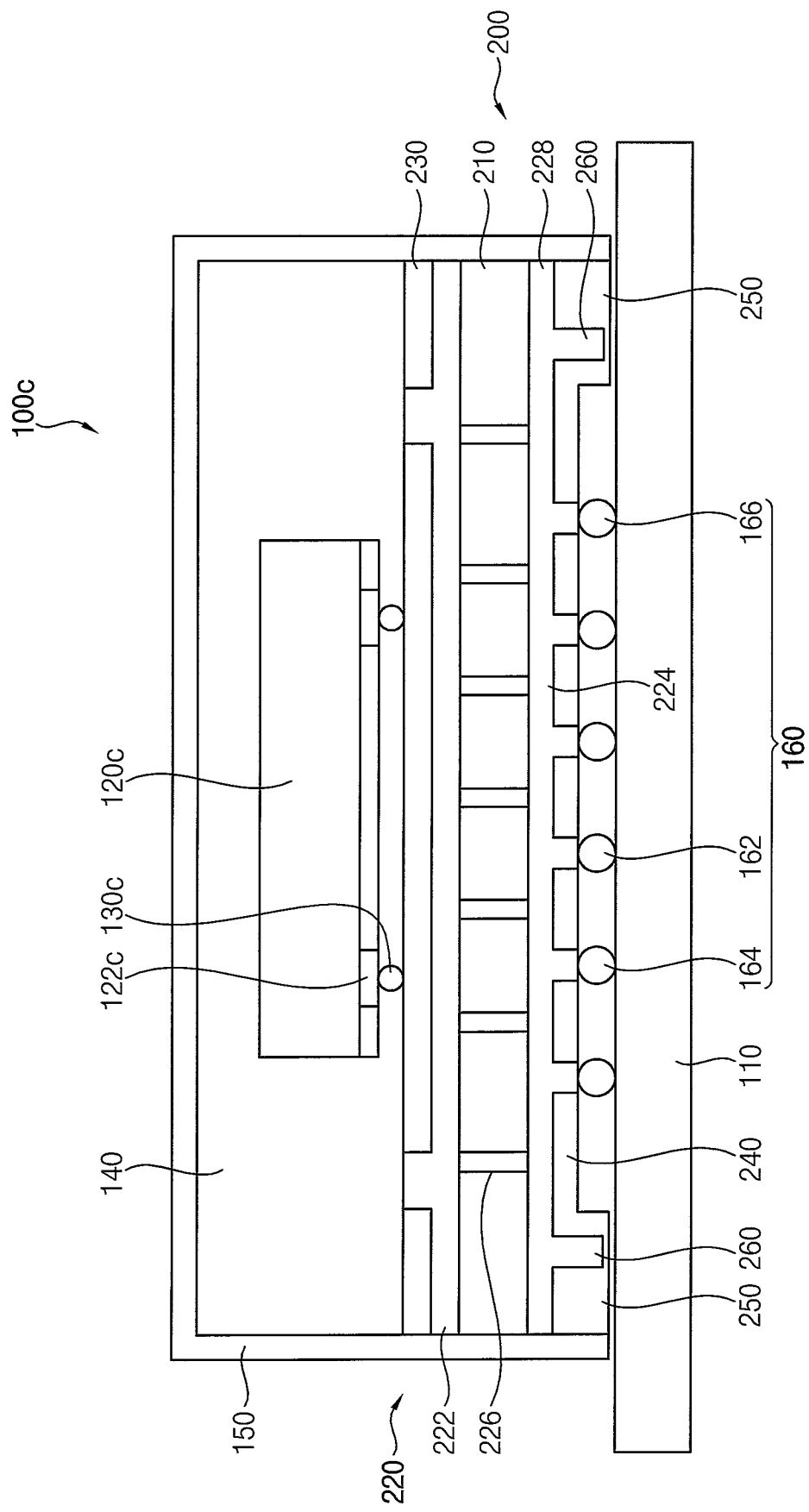

FIG. 7 is a cross-sectional view illustrating a semiconductor module according to an exemplary embodiment of the present inventive concepts.

A semiconductor module 100c of the exemplary embodiment of FIG. 7 may include elements substantially the same as those of the semiconductor module 100 in FIG. 1 except for a semiconductor chip. The same reference numerals may refer to the same elements and repeated descriptions of substantially similar elements may be omitted for convenience of explanation.

Referring to the exemplary embodiment of FIG. 7, a pad 122c may be disposed on a lower surface of a semiconductor chip 120c in contrast to the pad 122 disposed on the upper surface as shown in the exemplary embodiment of FIG. 1. Thus, the pad 122c of the semiconductor chip 120c may be electrically connected with the upper conductive pattern 222 of the package substrate 200 via conductive bumps 130c and conductive wires 130 may not be included in the semiconductor module 100c. While the exemplary embodiment of FIG. 7 shows the semiconductor module 100c including two conductive bumps 130c and two pads 122c, the numbers of the conductive bumps 130c and pads 122c may vary in other exemplary embodiments.

In another exemplary embodiment, the semiconductor module 100e may include the shielding fence 252 in the exemplary embodiment of FIG. 4 or the shielding fence 254 in the exemplary embodiment of FIG. 6.

Figure 8:
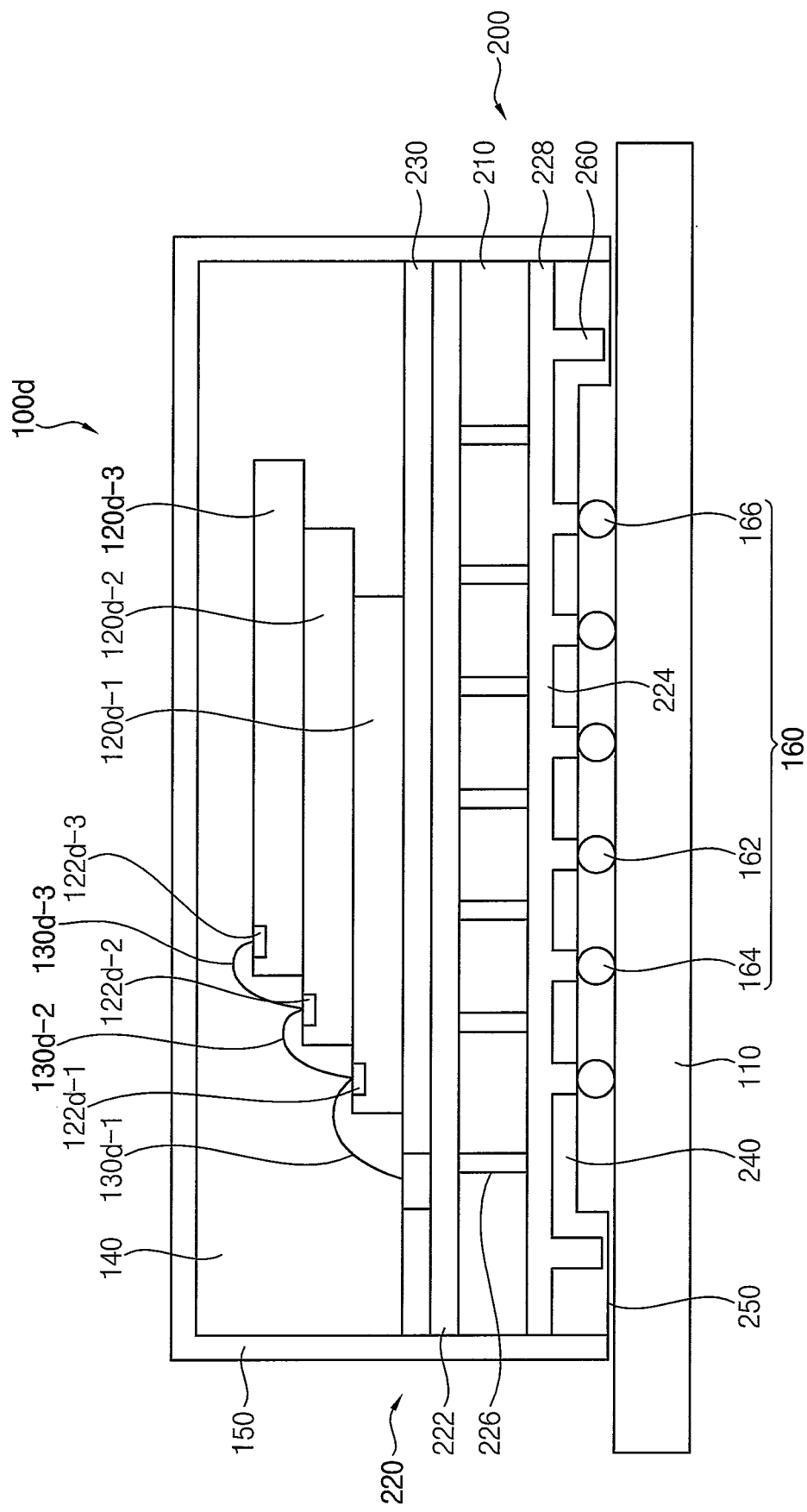

FIG. 8 is a cross-sectional view illustrating a semiconductor module according to an exemplary embodiment of the present inventive concepts.

A semiconductor module 100d of the exemplary embodiment of FIG. 8 may include elements that are substantially the same as the elements of the semiconductor module 100 in the exemplary embodiment of FIG. 1 except for a semiconductor chip. The same reference numerals may refer to the same elements and repeated descriptions of substantially similar elements may be omitted for convenience of explanation.

Referring to the exemplary embodiment of FIG. 8, a semiconductor package may include stacked first to third semiconductor chips 120d-1, 120d-2 and 120d-3. For example, as shown in the exemplary embodiment of FIG. 8, the first to third semiconductor chips 120d-1, 120d-2 and 120d-3 may be stacked in a steplike shape to expose pads 122d-1, 122d-2 and 122-3 of the first to third semiconductor chips 120d-1, 120d-2 and 120d-3, respectively. However, exemplary embodiments of the present inventive concepts are not limited thereto and the semiconductor package may include two or four or more semiconductor chips stacked in the steplike shape in other exemplary embodiments.

A first conductive wire 130d-1 may be electrically connected between the pad 122d-1 of the first semiconductor chip 120d-1 and the upper conductive pattern 222 of the package substrate 200. A second conductive wire 130d-2 may be electrically connected between the pad 122d-2 of the second semiconductor chip 120d-2 and the pad 122d-1 of the first semiconductor chip 120d-1. A third conductive wire 130d-3 may be electrically connected between the pad 122d-2 of the second semiconductor chip 120d-2 and the pad 122d-3 of the third semiconductor chip 120d-3.

In another exemplary embodiment, the semiconductor module 100d may include the shielding fence 252 in the exemplary embodiment of FIG. 4 or the shielding fence 254 in the exemplary embodiment of FIG. 6.

Figure 9:
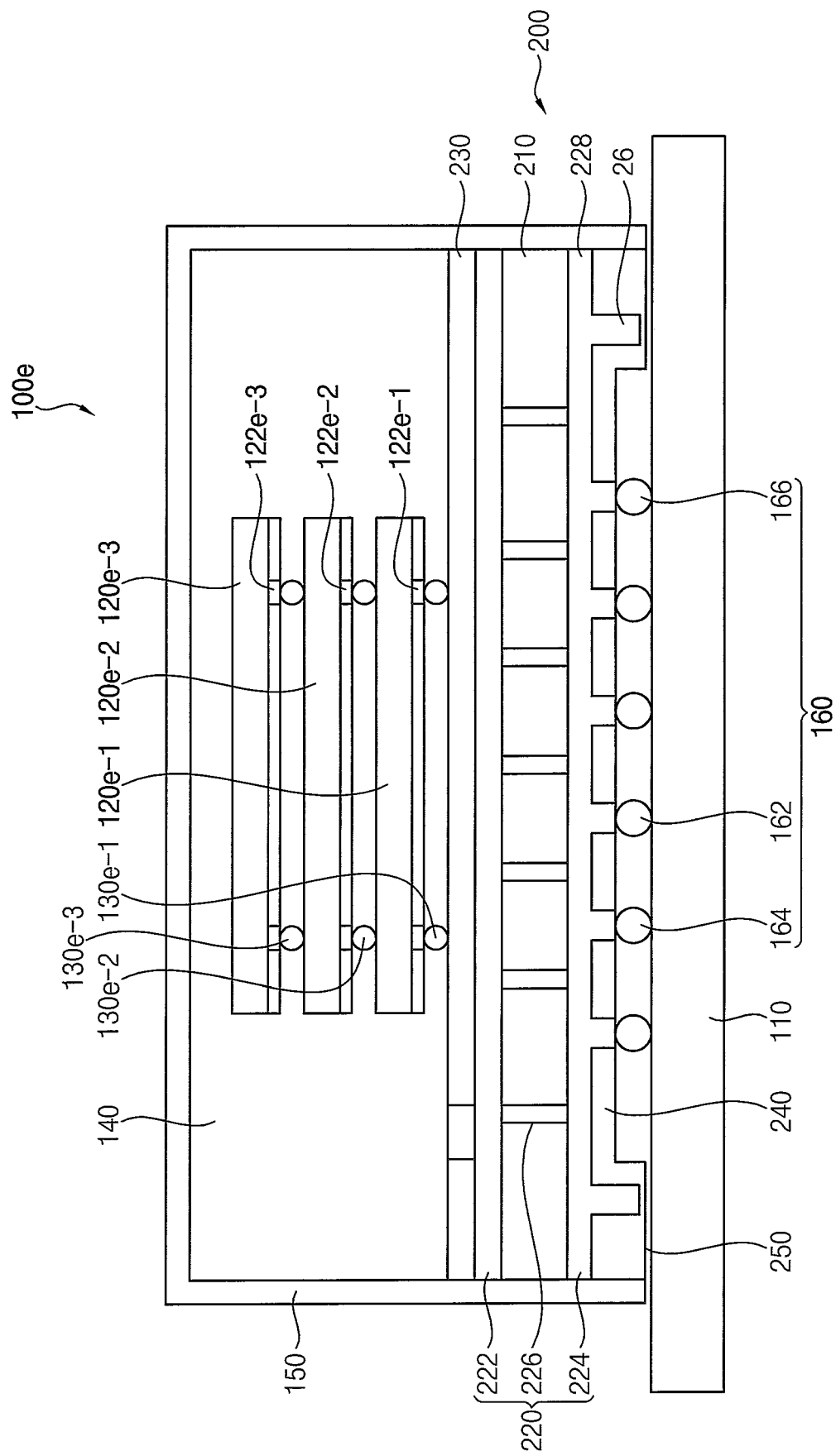

FIG. 9 is a cross-sectional view illustrating a semiconductor module in accordance with an exemplary embodiment of the present inventive concepts.

A semiconductor module 100e of the exemplary embodiment of FIG. 9 may include elements that are substantially the same as the elements of the semiconductor module 100 in the exemplary embodiment of FIG. 1 except for a semiconductor chip. The same reference numerals may refer to the same elements and repeated descriptions of substantially similar elements may be omitted for convenience of explanation.

Referring to the exemplary embodiment of FIG. 9, a semiconductor package of may include stacked first to third semiconductor chips 120e-1, 120e-2 and 120e-3. As shown in the exemplary embodiment of FIG. 9, the first to third semiconductor chips 120e-1, 120e-2 and 120e-3 may completely overlap each other and may not be disposed in a steplike shape. Pads 122e-1, 122e-2 and 122e-3 may be disposed on lower surfaces of the first to third semiconductor chips 120e-1 120e-2 and 120e-3, respectively. The first to third semiconductor chips 120e-1, 120e-2 and 120e-3 may include connection vias that extend vertically in the first to third semiconductor chips 120e-1, 120e-2 and 120e-3. However, exemplary embodiments of the present inventive concepts are not limited thereto and the semiconductor package may include two or four or more semiconductor chips in other exemplary embodiments.

A first conductive bump 130e-1 may be interposed between the package substrate 200 and the first semiconductor chip 120e-1 to electrically connect the pad 122e-1 of the first semiconductor chip 120e-1 with the upper conductive pattern 222 of the package substrate 200. A second conductive bump 130e-2 may be interposed between the second semiconductor chip 120e-2 and the first semiconductor chip 120e-1 to electrically connect the pad 122e-1 of the first semiconductor chip 120e-1 with the pad 122e-2 of the second semiconductor chip 120e-2. A third conductive bump 130e-3 may be interposed between the second semiconductor chip 120e-2 and the third semiconductor chip 120e-3 to electrically connect the pad 122e-3 of the third semiconductor chip 120e-3 with the pad 122e-2 of the second semiconductor chip 120e-2. While the exemplary embodiment of FIG. 9 shows two pads 122e-1, 122e-2, 122e-3 and two conductive bumps 130e-1, 130e-2, 130e-3 for each of the first to third semiconductor chips 120e-1, 120e-2, 120e-3, exemplary embodiments of the present inventive concepts are not limited thereto and the numbers of the pads and conductive bumps for each semiconductor chip may vary in other exemplary embodiments.

In another exemplary embodiment, the semiconductor module 100d of may include the shielding fence 252 in the exemplary embodiment of FIG. 4 or the shielding fence 254 in the exemplary embodiment of FIG. 6.

According to exemplary embodiments of the present inventive concepts, the shielding fence may surround the external terminals to shield the EMI emitted from the external terminals. For example, the shielding fence may be integral with the lower insulation pattern and may extend from the lower insulation pattern. Thus, it may not be an additional process may not be required to form the shielding fence. Further, the shielding plate may be electrically connected with the ground terminal through the conductive pattern to discharge the EMI emitted from the semiconductor chip through the ground terminal.

The foregoing is illustrative of exemplary embodiments of the present inventive concepts and is not to be construed as limiting thereof. Although a few exemplary embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts. In the claims, means-plus-function clauses are intended to cover the structures described herein as performing the recited function and equivalent structures. Therefore, it is to be understood that the foregoing is illustrative of various exemplary embodiments and the present inventive concepts are not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor module comprising:
a main board;
a plurality of external terminals disposed on an upper surface of the main board;
a package substrate including a core insulation layer, a conductive pattern disposed on the core insulation layer and configured to be electrically connected with the plurality of external terminals, an upper insulation pattern and a lower insulation pattern, the upper insulation pattern is disposed on an upper surface of the core insulation layer and partially exposes the conductive pattern, and the lower insulation pattern is disposed on a lower surface of the core insulation layer and partially exposes the conductive pattern;
at least one semiconductor chip disposed on an upper surface of the package substrate and configured to be electrically connected with the conductive pattern;

a molding member disposed on the upper surface of the package substrate and covering the at least one semiconductor chip; and a shielding plate disposed on an upper surface and lateral side surfaces of the molding member and lateral side surfaces of the package substrate and configured to shield electromagnetic interference (EMI) emitted from the at least one semiconductor chip, a shielding fence that extends from an edge portion of a lower surface of the lower insulation pattern, the shielding fence directly contacting the upper surface of the main board, the shielding fence surrounds the external terminals and is configured to shield EMI emitted from the plurality of external terminals, and a reinforcing member disposed in the shielding fence and configured to increase a strength of the shielding fence.

2. The semiconductor module of claim 1, wherein the reinforcing member is a part of the conductive pattern, the reinforcing member extends vertically from the conductive pattern to the shielding fence.

3. The semiconductor module of claim 1, wherein:
the plurality of external terminals includes a ground terminal; and
the conductive pattern includes a ground line,
wherein the ground line is configured to connect the shielding plate to the ground terminal.

4. A semiconductor module comprising:
a main board;
a plurality of external terminals disposed on an upper surface of the main board;
a package substrate including a core insulation layer, a conductive pattern disposed in the core insulation layer and configured to be electrically connected with the plurality of external terminals, an upper insulation pattern and a lower insulation pattern, the upper insulation pattern is disposed on an upper surface of the core insulation layer and partially exposes the conductive pattern, and the lower insulation pattern is disposed on a lower surface of the core insulation layer and partially exposes the conductive pattern;
at least one semiconductor chip disposed on an upper surface of the package substrate and configured to be electrically connected with the conductive pattern;
a molding member disposed on the upper surface of the package substrate and covering the at least one semiconductor chip;
a shielding plate disposed on an upper surface and lateral side surfaces of the molding member and lateral side surfaces of the package substrate and configured to shield electromagnetic interference (EMI) emitted from the at least one semiconductor chip; and
a shielding fence disposed between an edge portion of a lower surface of the lower insulation pattern and the upper surface of the main board, the shielding fence surrounds the plurality of extern al terminals and is configured to shield EMI emitted from the external terminals.

5. The semiconductor module of claim 4, wherein the shielding fence is a part of the lower insulation pattern and extends from the edge portion of the lower surface of the lower insulation pattern towards the main board.

6. The semiconductor module of claim 5, wherein the shielding fence has a thickness in a range of about ⅔ a thickness of the plurality of external terminals to less than the thickness of the plurality of external terminals.

7. The semiconductor module of claim 5, wherein the shielding fence directly contacts the upper surface of the main board.

8. The semiconductor module of claim 4, further comprising a reinforcing member disposed in the shielding fence, the reinforcing member is configured to increase a strength of the shielding fence.

9. The semiconductor module of claim 8, wherein the reinforcing member is a part of the conductive pattern, the reinforcing member extends vertically from the conductive pattern to the shielding fence.

10. The semiconductor module of claim 4, wherein:
the external terminals include a ground terminal; and
the conductive pattern includes a ground line,
wherein the ground line is configured to connect the shielding plate to the ground terminal.

11. A semiconductor module comprising:
a main board;
a plurality of external terminals disposed on an upper surface of the main board;
a semiconductor package disposed over the main board, the semiconductor package including a shielding fence surrounding the external terminals and configured to shield electromagnetic interference (EMI) emitted from the external terminals, wherein the plurality of external terminals is configured to electrically connect the semiconductor package with the main board; and
a shielding plate disposed on an upper surface and lateral side surfaces of a molding member and lateral side surfaces of the package substrate; and
a shielding fence surrounding the semiconductor package, the shielding fence electrically connecting to a ground terminal among the external terminals and the shielding fence is configured to discharge an EMI emitted from the semiconductor package through the ground terminal.

12. The semiconductor module of claim 11, wherein the semiconductor package comprises:
a package substrate including a core insulation layer, a conductive pattern disposed in the core insulation layer and configured to be electrically connected with the plurality of external terminals, an upper insulation pattern and a lower insulation pattern, the upper insulation pattern is disposed on an upper surface of the core insulation layer and partially exposing the conductive pattern, and the lower insulation pattern is disposed on a lower surface of the core insulation layer and partially exposing the conductive pattern;
at least one semiconductor chip disposed on an upper surface of the package substrate and configured to be electrically connected with the conductive pattern; and
a molding member disposed on the upper surface of the package substrate and covering the at least one semiconductor chip,
wherein the shielding plate is configured to shield EMI emitted from the at least one semiconductor chip.

13. The semiconductor module of claim 12, wherein the shielding fence is disposed between an edge portion of a lower surface of the lower insulation pattern and the upper surface of the main board.

14. The semiconductor module of claim 13, wherein the shielding fence is a part of the lower insulation pattern and extends from the edge portion of the lower surface of the lower insulation pattern towards the main board.

15. The semiconductor module of claim 14, wherein the shielding fence has a thickness in a range of about ⅔ a thickness of the plurality of external terminals to less than the thickness of the plurality of external terminals.

16. The semiconductor module of claim 14, wherein the shielding fence directly contacts the upper surface of the main board.

17. The semiconductor module of claim 13, wherein the semiconductor for package further comprises a reinforcing member disposed in the shielding fence, the reinforcing member is configured to increase a strength of the shielding fence.

18. The semiconductor module of claim 17, wherein the reinforcing member is a part of the conductive pattern, the reinforcing member extends vertically from the conductive pattern to the shielding; fence.

19. The semiconductor for module of claim 12, wherein the shielding plate directly contacts an upper surface and lateral side surfaces of the molding member and lateral side surfaces of the package substrate.

20. The semiconductor module of claim 11, wherein the shielding fence is disposed outside of the shielding plate.

* * * * *